US009761066B2

(12) United States Patent
Chen et al.

(10) Patent No.: US 9,761,066 B2
(45) Date of Patent: Sep. 12, 2017

(54) SYSTEM AND METHOD FOR MONITORING THE STATUS OF A VEHICLE BATTERY SYSTEM

(71) Applicant: Innova Electronics, Inc., Irvine, CA (US)

(72) Inventors: Ieon C. Chen, Laguna Hills, CA (US); Phuong Pham, Fountain Valley, CA (US)

(73) Assignee: Innova Electronics Corporation, Irvine, CA (US)

( * ) Notice: Subject to any disclaimer, the term of this patent is extended or adjusted under 35 U.S.C. 154(b) by 352 days.

(21) Appl. No.: 14/096,385

(22) Filed: Dec. 4, 2013

(65) Prior Publication Data
US 2015/0154816 A1 Jun. 4, 2015

(51) Int. Cl.
G07C 5/08 (2006.01)
G01R 31/00 (2006.01)
G07C 5/00 (2006.01)
G01R 31/36 (2006.01)
G01R 31/34 (2006.01)

(52) U.S. Cl.
CPC ............ G07C 5/08 (2013.01); G01R 31/343 (2013.01); G01R 31/362 (2013.01); G01R 31/3689 (2013.01); G07C 5/008 (2013.01); G07C 5/0825 (2013.01); G01R 31/007 (2013.01)

(58) Field of Classification Search
CPC ........ G08B 21/18; G01R 31/36; G01R 31/00; G07C 5/08; G01M 17/007; H02H 7/06; H02P 9/00
See application file for complete search history.

(56) References Cited

U.S. PATENT DOCUMENTS

| D334,560 S | 4/1993 | Wilson |
| 5,347,211 A | 9/1994 | Jakubowski |
| D377,622 S | 1/1997 | Chen |
| 5,635,841 A | 6/1997 | Taylor |
| 5,758,300 A | 5/1998 | Abe |
| 5,767,681 A | 6/1998 | Huang |
| 5,809,437 A | 9/1998 | Breed |
| 5,859,628 A | 1/1999 | Ross et al. |
| 5,884,202 A | 3/1999 | Arjomand |
| 6,000,413 A | 12/1999 | Chen |

(Continued)

Primary Examiner — Yonel Beaulieu
Assistant Examiner — Martin Weeks
(74) Attorney, Agent, or Firm — Stetina Brunda Garred and Brucker

(57) ABSTRACT

A system for monitoring the status of a vehicle utilizing a monitoring unit and a receiver unit. The monitoring unit is operatively connectable to the vehicle via a diagnostic port and detects the voltage output by the vehicle's battery when the vehicle's engine is turned on and off, and voltage output by the alternator while the engine is running. From these voltage measurements, the monitoring unit determine the operational status of the vehicle's battery and alternator by comparison to predefined criteria, such as optimal voltage ranges or a threshold minimum voltage. When the monitoring unit detects that the vehicle's battery or alternator may be malfunctioning, a signal indicating a malfunction is transmitted to the receiver unit, for example the driver's cellular phone, which will generate a warning notification alerting the operator to the existence and component responsible for the malfunction.

21 Claims, 8 Drawing Sheets

(56) References Cited

U.S. PATENT DOCUMENTS

| | | |
|---|---|---|
| 6,055,468 A | 4/2000 | Kaman et al. |
| 6,094,609 A | 7/2000 | Arjomand |
| 6,169,943 B1 | 1/2001 | Simon et al. |
| 6,225,898 B1 | 5/2001 | Kamiya et al. |
| 6,263,268 B1 | 7/2001 | Nathanson |
| 6,389,337 B1 | 5/2002 | Kolls |
| 6,438,471 B1 | 8/2002 | Katagishi et al. |
| 6,499,385 B2 | 12/2002 | Protti |
| 6,535,112 B1 | 3/2003 | Rothshink |
| 6,587,768 B2 | 7/2003 | Chene et al. |
| 6,611,740 B2 | 8/2003 | Lowrey et al. |
| 6,650,318 B1 | 11/2003 | Arnon |
| 6,732,031 B1 | 5/2004 | Lightner et al. |
| 6,807,469 B2 | 10/2004 | Funkhouser et al. |
| 6,816,760 B1 | 11/2004 | Namaky |
| 6,836,708 B2 | 12/2004 | Tripathi |
| 6,847,916 B1 | 1/2005 | Ying |
| 6,868,369 B2 | 3/2005 | Huang |
| 6,925,368 B2 | 8/2005 | Funkhouser et al. |
| 6,940,270 B2 | 9/2005 | Chen |
| D510,287 S | 10/2005 | Chen |
| 6,957,133 B1 | 10/2005 | Hunt et al. |
| 6,968,733 B2 | 11/2005 | Andreasen |
| 7,030,742 B2 | 4/2006 | Treadway |
| 7,039,534 B1 * | 5/2006 | Ryno et al. ............. 702/63 |
| 7,085,680 B2 | 8/2006 | Huang |
| 7,116,216 B2 | 10/2006 | Andreasen |
| 7,209,813 B2 | 4/2007 | Namaky |
| RE39,619 E | 5/2007 | Andreasen |
| D545,223 S | 6/2007 | Chen |
| D558,621 S | 1/2008 | Rich |
| D559,137 S | 1/2008 | Protti |
| D560,129 S | 1/2008 | Rich |
| D560,527 S | 1/2008 | Rich |
| 7,325,775 B2 | 2/2008 | Chen |
| D563,249 S | 3/2008 | Chen |
| 7,363,149 B2 | 4/2008 | Klausner et al. |
| D569,280 S | 5/2008 | Chen |
| 7,376,497 B2 | 5/2008 | Chen |
| D571,241 S | 6/2008 | Andreasen |
| 7,437,227 B2 | 10/2008 | Andreasen |
| D581,822 S | 12/2008 | Madison |
| 7,463,959 B2 | 12/2008 | Namaky |
| 7,464,000 B2 | 12/2008 | Huang |
| D590,387 S | 4/2009 | Chen |
| 7,520,668 B2 | 4/2009 | Chen |
| RE40,798 E | 6/2009 | Chen |
| RE40,799 E | 6/2009 | Chen |
| 7,603,293 B2 | 10/2009 | Chen |
| D610,586 S | 2/2010 | Chen |
| 7,734,390 B2 | 6/2010 | Chen |
| 7,751,953 B2 | 7/2010 | Namaky |
| D624,446 S | 9/2010 | Chen |
| D624,838 S | 10/2010 | Chen |
| D625,209 S | 10/2010 | Chen |
| D625,210 S | 10/2010 | Chen |
| D625,634 S | 10/2010 | Chen |
| 7,904,219 B1 | 3/2011 | Lowrey et al. |
| 7,974,750 B2 | 7/2011 | Namaky |
| 8,019,503 B2 | 9/2011 | Andreasen |
| 8,024,083 B2 | 9/2011 | Chen |
| D646,188 S | 10/2011 | Chen |
| D646,599 S | 10/2011 | Chen |
| 8,032,419 B2 | 10/2011 | Chen |
| 8,068,951 B2 | 11/2011 | Chen et al. |
| 8,301,329 B2 | 10/2012 | Andreasen |
| 8,306,687 B2 | 11/2012 | Chen |
| 8,370,018 B2 | 2/2013 | Andreasen et al. |
| 8,630,765 B2 | 1/2014 | Chen |
| 2003/0171111 A1 | 9/2003 | Clark |
| 2004/0110472 A1 | 6/2004 | Witkowski |
| 2007/0085510 A1 * | 4/2007 | Asada ............... H02P 29/032 322/28 |
| 2007/0182248 A1 * | 8/2007 | Blaker ............... B60L 1/00 307/10.1 |
| 2008/0183408 A1 * | 7/2008 | Matsuura ........... G01R 31/3651 702/63 |
| 2009/0276115 A1 | 11/2009 | Chen |
| 2011/0082621 A1 * | 4/2011 | Berkobin et al. ............ 701/33 |
| 2011/0224866 A1 | 9/2011 | Chen |
| 2011/0264322 A1 | 10/2011 | Chen |
| 2012/0010775 A1 | 1/2012 | Chen |
| 2012/0083970 A1 | 4/2012 | Owens et al. |
| 2012/0197486 A1 | 8/2012 | Elliott |
| 2012/0215398 A1 | 8/2012 | Chen |
| 2012/0215400 A1 | 8/2012 | Namaky |
| 2013/0127611 A1 * | 5/2013 | Bernstein et al. ............ 340/455 |
| 2013/0197741 A1 | 8/2013 | Bertosa et al. |
| 2013/0211623 A1 | 8/2013 | Thompson et al. |
| 2014/0046800 A1 | 2/2014 | Chen |
| 2014/0052328 A1 | 2/2014 | Nguyen |
| 2014/0107976 A1 * | 4/2014 | Kallfelz et al. ............ 702/182 |
| 2014/0358367 A1 * | 12/2014 | Copeland et al. ............ 701/36 |
| 2014/0374475 A1 * | 12/2014 | Kallfelz et al. ............ 235/375 |

* cited by examiner

| Table 1 | | Vehicle Off Voltage (v) | | | |
|---|---|---|---|---|---|
| | | 12.46-12.72 | 12.28-12.45 | 12.20-12.29 | < 12.19 |
| Vehicle Minimum Voltage (v) | > 10 | Good | Good | OK | Malfunction |
| | 9.71-10 | Good | OK | OK | Malfunction |
| | 9.6-9.7 | OK | Malfunction | Malfunction | Malfunction |
| | < 9.6 | Malfunction | Malfunction | Malfunction | Malfunction |

FIG. 8

SYSTEM AND METHOD FOR MONITORING THE STATUS OF A VEHICLE BATTERY SYSTEM

CROSS-REFERENCE TO RELATED APPLICATIONS

Not applicable

STATEMENT RE: FEDERALLY SPONSORED RESEARCH/DEVELOPMENT

Not applicable

BACKGROUND

1. Technical Field

The present disclosure relates generally to vehicle diagnostic systems. More particularly, the present disclosure relates to a system and method for passively monitoring the operational status of the alternator and battery of a vehicle and rapidly alerting a user to malfunctions.

2. Related Art

Electrical power in vehicles with internal combustion engines typically comes from two sources: the battery and the alternator. When the engine is not running, an automotive battery is used to power vehicle systems, such as lights and other electronics. However, the battery's most essential and power-consuming function is to provide power to the engine's starter motor and ignition system. Typically, automotive batteries are made of six galvanic cells and provide an open-circuit voltage of around 12.6 volts when fully charged and properly functioning.

When a vehicle's engine is running, electrical power is usually provided to vehicle systems by the alternator. A vehicle's alternator converts the mechanical motion of the engine into electrical current, which is used to both power the electrical systems of the vehicle and to recharge the battery. Typically, vehicle alternators produce an output of about 14 volts when properly functioning.

When vehicles fail to start, it is very common that an alternator or battery malfunction is the cause. Such failures are often sudden and without warning, and may leave motorists stranded. Diagnosis of a malfunctioning battery or alternator prior to failure may be a difficult task, which may be especially burdened by the interrelation between the two components. A battery which is not providing enough power to start the engine may be malfunctioning, or may be properly functioning, but not being sufficiently recharged due to a malfunctioning alternator.

Because initiation of the starter motor and ignition system is usually the most power-intensive function of a vehicle's battery, the failure of a vehicle to start is often sudden and unexpected, and may occur even though other vehicle components which use electricity may appear to be in complete working order. This is quite unlike many other common vehicle problems, in which components may suffer a slow and noticeable decline. When a battery or alternator is malfunctioning, the failure of their vehicle to run can often be the first sign of trouble for a motorist, rather than the last, and may leave motorists stranded when they least expect.

It is therefore desirable to provide a system which may notify drivers that their vehicle battery or alternator may be malfunctioning prior to the ultimate failure of their vehicle to start, and which may pinpoint the component that is actually suffering the malfunction in a way which alerts the driver to the potential problem with more specificity than a check engine light. Ideally, such a system would be usable in many vehicles, without requiring substantial vehicle modifications to be compatible with the system, and would be equally compatible in newer vehicles with more advanced electronic systems as well as in older vehicles without such features.

These and other advantages are implemented in the present invention, as described in further detail below.

BRIEF SUMMARY

To solve these and other problems, a system for monitoring the status of a vehicle is contemplated which utilizes a monitor, or a monitoring unit, and a receiver unit. The monitoring unit is operatively connectable to the vehicle electrical system and detects the voltage status output by the vehicle's battery and alternator at different points during the operation of the vehicle. From these voltage measurements, the monitoring unit may determine the operational status of the vehicle's battery and alternator by comparison to predefined criteria, such as optimal voltage ranges or a threshold minimum voltage. When the monitoring unit detects that the vehicle's battery or alternator may be malfunctioning, it wirelessly transmits a signal to a receiver unit, such as the vehicle operator's cellphone, which will generate a warning notification alerting the operator to the existence and source of the malfunction prior to failure of the component.

As a vehicle is started, a voltage fluctuation of the voltage output by the battery occurs due to the power drawn by the starter motor. This fluctuation has signal attributes which are detected by the monitoring unit, prompting the monitoring unit to measure the vehicle minimum voltage of that fluctuation. Subsequently, after the vehicle has started, a vehicle running voltage is generated by the vehicle's alternator, and is measured by the monitoring unit. The monitoring unit compares the vehicle running voltage to a first predefined criteria to determine a vehicle alternator status representative of an operational condition of the alternator. After the vehicle has been turned off, the monitoring unit measures the vehicle off voltage output at the battery. The vehicle off voltage is compared to the vehicle minimum voltage in accordance to second predefined criteria to determine a vehicle battery status representative of an operational condition of the battery.

Once a vehicle alternator status and vehicle battery status has been determined, the monitoring unit communicates an alternator status signal and a battery status signal to a receiver unit, such as the vehicle operator's cellphone. The receiver unit will then generate a warning notification when the received alternator status signal or battery status signal is representative of a malfunctioning operational condition of the alternator or battery. Certain implementations may only transmit a status signal from the monitoring unit to the receiver unit when the status signal is representative of a malfunctioning operational condition. Other implementations may transmit status signals representative of component operational conditions as well, those signals being an alternator malfunction signal and a battery malfunction signal.

The first predefined criteria can be a voltage range representative of the voltage output of a properly functioning alternator, and the vehicle alternator status would be determined to be in a malfunctioning operational condition when the vehicle running voltage is outside of the normal operations voltage range of the alternator. For typical alternators, this range may be from 13.2 volts to 15.1 volts.

The second predefined criteria can be a set of conditions representative of a properly functioning vehicle battery. Such conditions may be indicative that the battery is not sufficiently retaining a charge, and/or may be criterion for a minimum battery voltage output level.

The monitoring unit has a data processor in communication with the battery and alternator, e.g. via a vehicle electronic control unit (ECU) for measuring the above criteria and making the above determinations. The monitoring unit may also have a wireless communication circuit, in communication with the data processor, for transmitting the alternator status signal or battery status signal to the receiver unit. The receiver unit, which can be the vehicle operator's cellular telephone, has a wireless receiver, or a wireless receiving circuit, for receiving the alternator malfunction signal or the battery malfunction signal from the monitoring unit.

Additionally, the monitoring unit may communicate vehicle identification information, such as a vehicle identification (VIN) number to the receiver unit. In certain embodiments, a single receiver unit may receive alternator and battery malfunction signals from multiple monitoring units.

Once a battery malfunction signal or an alternator malfunction signal, or an alternator or battery status signal representative of an alternator or battery malfunction is received on a receiver unit, the receiver unit is then operative to generate a battery malfunction warning notification or an alternator malfunction warning notification.

It is additionally contemplated that an article of manufacture comprising a non-transitory computer readable medium readable by a data processing apparatus including an output device, in which the medium tangibly embodies one or more programs of instructions executable by the data processing apparatus, may be employed to perform the method of receiving the alternator status signal or battery status signal and generating a warning notification in response to receipt thereof.

It is also contemplated that the monitoring unit may transmit the raw voltage measurements as described above to the receiver unit, and that the determinations of the alternator and battery statuses representative of the alternator and battery operational conditions may occur on a data processor located on the receiver unit.

Furthermore, it is contemplated that such a system may be utilized with hybrid vehicles which utilize batteries having higher voltages to provide primary motive power for the vehicle whole or in part. In such a system, instead of checking the battery voltage outputs directly at the battery, a battery control module, or a battery controller, may be queried, and from the output of the battery control module a battery operational condition may be determined.

BRIEF DESCRIPTION OF THE DRAWINGS

These and other features and advantages of the various embodiments disclosed herein will be better understood with respect to the following description and drawings, in which:

FIG. 8 is an exemplary decision matrix for determining the operational status of a battery.

Common reference numerals are used throughout the drawings and the detailed description to indicate the same elements.

DETAILED DESCRIPTION

According to various aspects of the present invention, a system, article of manufacture, and associated method are contemplated wherein a monitoring unit operatively connected to a vehicle may monitor the voltage output of a vehicle's battery and alternator at specific points during the vehicle's normal usage, and from those voltages determinations may be made of the operational condition of the vehicle's alternator and battery. A signal representative of the operational conditions of the alternator and battery may then be transmitted to a receiver unit such as the user's cellular phone, allowing the user to easily consult the status of their vehicle's alternator and battery. The system may be configured to alert the user with a warning notification generated on their cellular phone if their vehicle's alternator or battery are determined to be malfunctioning. Alternatively, a signal may only need to be sent from the monitoring unit if a malfunction is detected.

Figure 1:
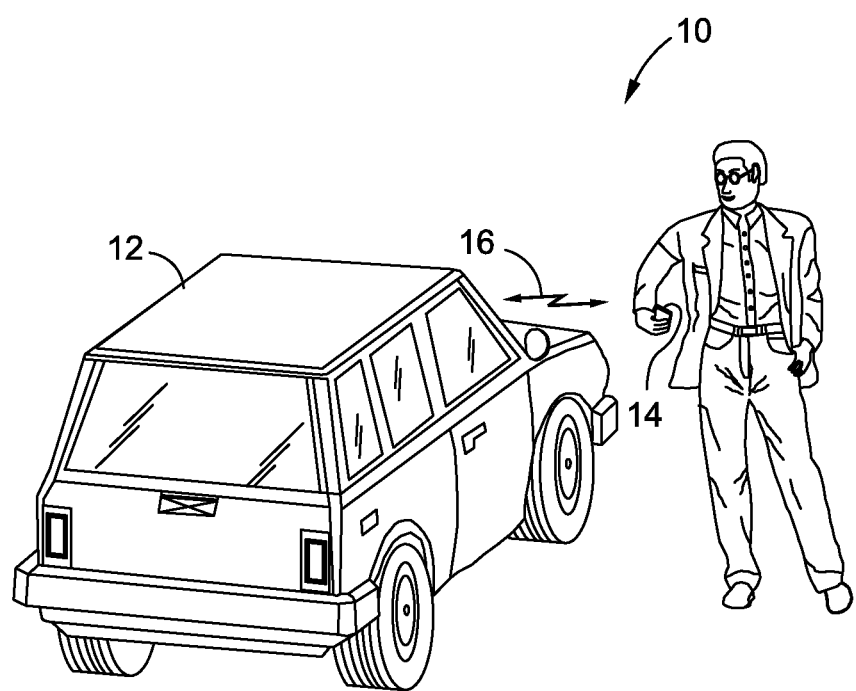
FIG. 1 is a perspective view of a vehicle and a user with a receiver unit.

Referring now to the drawings, and more specifically to FIG. 1, an illustration of the use of system for monitoring a vehicle status 10 of a vehicle 12 is shown. According to this particular embodiment, when a user receives a status signal 16 on a receiver unit 14, the user may be apprised of the condition of their vehicle's electrical power supply system as further described below.

Figure 2:
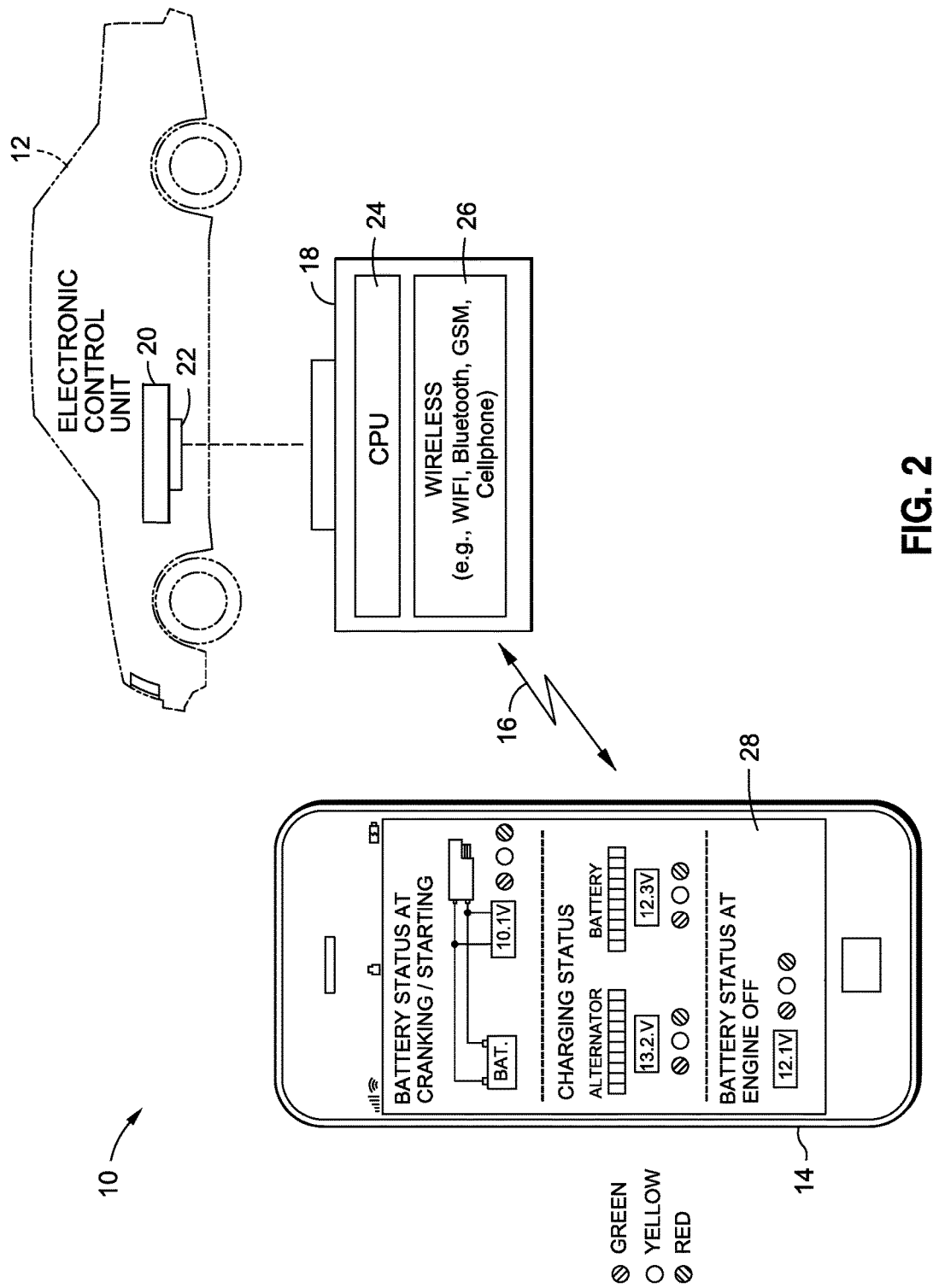
FIG. 2 is an illustration showing exemplary interconnections between components of the system.

Referring now to FIG. 2, an illustration of an exemplary system for monitoring a vehicle status 10 is shown. According to this particular embodiment, a monitoring unit 18 is used to monitor the electrical power supply system status of a vehicle 12 by an operatively connection of the monitoring unit 18 to the vehicle's electronic control unit 20. The monitoring circuit 24 of the monitoring unit 18 may detect voltages of the vehicle's electrical power supply system and may then generate status signals 16 representative of the operational condition of the electrical power supply system. The status signals 16 may then be transmitted via wireless communication circuit 26 to the receiver unit 14, allowing the potential generation of warning notifications on an output device 28 of the receiver unit 14.

It is contemplated that the monitoring unit 18 may be implemented as a dongle that is connectable to the vehicle diagnostic port, or fully integrated within the vehicle 12. The monitoring circuit 24 of the monitoring unit 18 may communicate with the vehicle's electronic control unit 12 or another vehicle component to detect and monitor vehicle electrical power supply system voltages. Such communication may be in any fashion in which devices communicate, including but not limited to wired electronic communication, wireless communication, or mechanical linkage. In the exemplary embodiment, the monitoring unit 18 may be plugged into a vehicle diagnostic port 22, so that the monitoring unit 18 may be capable of being used with many different makes and models of a vehicle 12. This is because a vehicle diagnostic port 22 is a common feature found in many if not all vehicles 12 manufactured and in use today.

Since 1996, the OBD-II diagnostic port is the standard vehicle diagnostic port 22 is commonly found on vehicles manufactured in the United States and worldwide. Other vehicle diagnostic port 22 standards also exist, primarily on pre-1996 models, or may exist in the future, and it may be seen that the monitoring unit 18 may be manufactured to be compatible with such vehicle diagnostic ports 22 as well, or may be made compatible with such vehicle diagnostic ports 22 through the use of adapters or other equipment.

The monitoring circuit 24 may be, in one exemplary embodiment, a data processor such as a central processing unit (CPU) housed within the monitoring device 22. However, it may be seen that the monitoring circuit 24 may be implemented as any circuit capable of interfacing with a vehicle 12 so as to detect voltage levels in the electrical power supply system of the vehicle 12. It may be seen that in other embodiments, the monitoring circuit 24 may be, for example but without limitation, integrated with the vehicle electrical control unit 20 or be embodied by the vehicle electrical control unit 20.

Wireless communication circuit 26 may be, for example but without limitation, a local transmitter such as a Wi-Fi or Bluetooth transmitter, or a long-range transmitter such as a radio transmitter. In one exemplary embodiment, the wireless communication circuit 26 is a Bluetooth transmitter. However, it may be seen that any wireless transmitter may be used which may convey the status signals 16 from the wireless communication circuit 26 of the monitoring unit 18 to the receiver unit 14. In one exemplary embodiment, it is contemplated that such conveyance of the status signals 16 will occur over a very short distance, as the receiver unit 14 in this exemplary embodiment is a cellular telephone typically carried on or near to the user's person, typically the driver or a passenger in the vehicle 12, and the status signals 16 will usually be sent when the user is within or in close proximity to the vehicle 12.

The receiver unit 14, in the exemplary embodiment, is a cellular telephone having a receiver unit output device 28. However, it may be seen that the receiver unit 14 may be any device capable of receiving status signals 16, and generating a warning notification in response to receipt of status signals 16 corresponding to a malfunction in the vehicle's electrical power supply system. One exemplary embodiment contemplates that the output receiver unit output device 28 of the cellular telephone is a graphical display, such as those found on smart phones with mobile operating systems. However, it may also be seen that other apparatuses may be used as the receiver unit 14, including cellular telephones without mobile operating systems, devices in which monitoring vehicle electrical system status may be their primary function, devices in which the receiver unit output device 28 is not a graphical display, but may be for example a numerical display for displaying indicia, or an auditory or sensatory output device.

Figure 3:
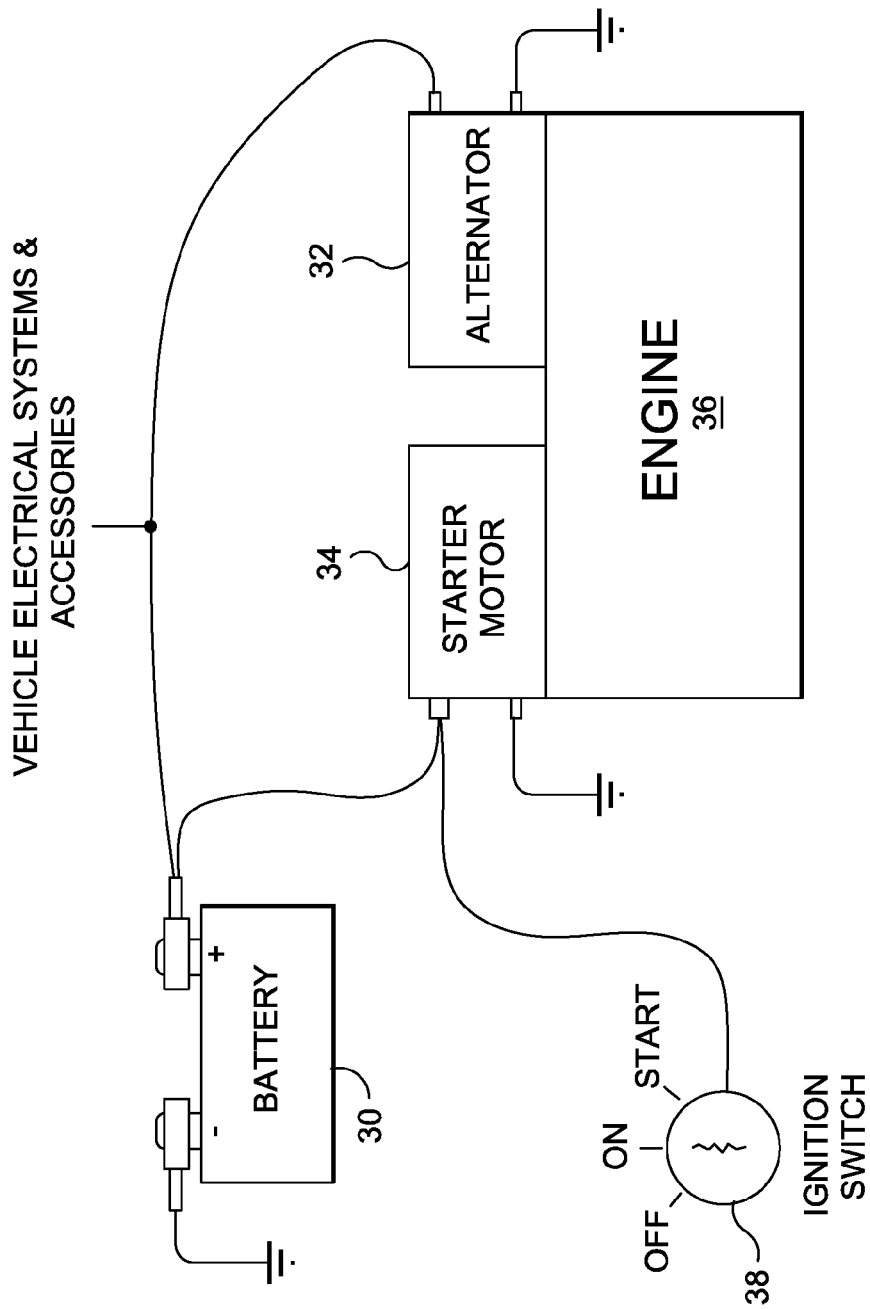
FIG. 3 is a diagram of an exemplary vehicle electrical power supply system.

Referring now to FIG. 3, a diagram of a typical vehicle electrical power supply system is shown. Typically, such a system has a battery 30, an alternator 32, a starter motor 34, an engine 36, and an ignition switch 38.

When the engine 36 is off, electrical power for the vehicle 12's electrical systems and accessories is usually provided by the battery 30. Additionally, the battery 30 provides the power to run the starter motor 34 to initiate the engine 36, when triggered by the ignition switch 38, which usually results in a substantial discharge of power. The characteristics of vehicle batteries 30 are well known in the art and it may be seen that aspects of the present application may be adapted to be utilized with any type of vehicle battery known in the art, without departing from the scope and spirit of the present invention. Typically, vehicle batteries 30 are rechargeable lead-acid or lithium-ion batteries which, when fully charged and in an operational condition will output electrical power at around 12.6 volts. However, it may be seen that the scope of the present invention includes embodiments which interface with batteries 30 which may output electrical power at other voltages.

When the engine 36 is running, electrical power for the vehicle 12's electronic systems and accessories is provided by the alternator 32, which converts the mechanical power produced by the engine 36 into electrical power. The alternator 32 also provides electrical power for recharging the battery 30. The characteristics of vehicle alternators 32 are well known in the art, and it may be seen that aspects of the present application may be adapted to be utilized with any type of alternator 32 known in the art, without departing from the scope and spirit of the present invention. Typically, passenger vehicle alternators 32 in an operational condition will output electrical power at around 14 volts. However, it is understood that the scope of the present invention includes embodiments which interface with alternators 32 which may output electrical power at other voltages.

Figure 4:
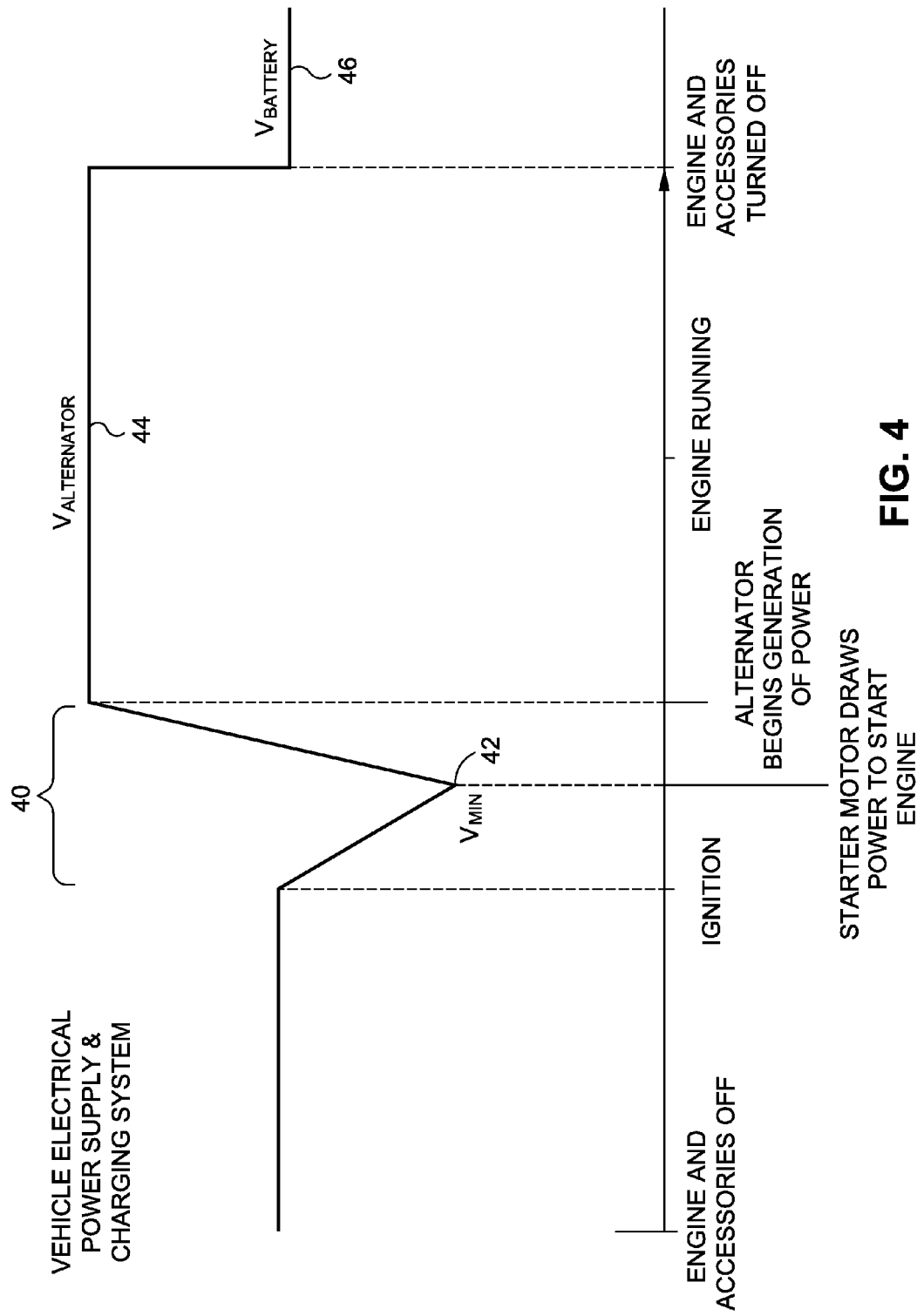
FIG. 4 is a timeline showing the voltage characteristics of a vehicle electrical power supply system during typical operation of a vehicle.

Referring now to FIG. 4, when the vehicle ignition switch 38 is triggered, the battery 30 is caused to transfer electrical power to the starter motor 34. Such a discharge may be seen to result in a voltage fluctuation 40, in which the voltage flowing to the vehicle electronic systems and accessories drops due to the power draw on the battery 30 from the starter motor 34. The voltage fluctuation 40 may be seen to have a vehicle minimum voltage 42. Subsequently, following ignition of the engine 36, the alternator 32 begins converting mechanical power produced by the engine 36 to electrical power. The electrical power produced by the alternator is typically output at a consistent vehicle running voltage 44, which is used to power vehicle electronic systems and accessories and recharge the battery 30. When the engine 36 is shut off, the alternator no longer produces electrical power, and any vehicle electrical systems which may still be desired to be powered return to being powered by the battery 30, which produces current having a vehicle off voltage 46.

Diagnosis of a malfunctioning battery 30 or alternator 32 according to a particular embodiment of the present application occurs first by detecting a voltage fluctuation 40 at the battery having characteristics of a starter motor 34 drawing power. Typically, such characteristics will include a rapid, large drop in voltage output at the battery 30, due to the large draw required by the starter motor 36 in comparison with other vehicle electrical systems. For a typical vehicle battery and starter motor found on a passenger vehicle, a voltage fluctuation 40 will have a drop of between two and three volts. However, it may be seen that other voltage fluctuations 40 may occur which are indicative of initiation of a starter motor 34. In a preferred embodiment, a monitoring unit 18 may remain in a passive state until it detects a voltage fluctuation 40 having the characteristics of a starter motor 34 being initiated, and will then transition into an active state.

Once the monitoring unit 18 has detected the voltage fluctuation 40, the vehicle minimum voltage 42 may be measured and stored. This vehicle minimum voltage may be the lowest point of the voltage fluctuation 40, and may represent the sum of the power draw on the battery 30 from the starter motor 34. In the usage of a typical and functionally operating vehicle 12, the vehicle minimum voltage 42 will be the point of maximum battery discharge during use of the vehicle 12, because following initiation of the engine by the starter motor 34, the alternator 32 will recharge the battery 30. In a particular embodiment with a typical passenger vehicle battery 30, the vehicle minimum voltage 42 output by the battery 30 will be above 9.6 volts, and a vehicle minimum voltages 42 of less than 9.6 volts may be indicative that the battery is not sufficiently retaining a charge.

After the vehicle 12 has started, the monitoring unit 18 may then measure and store the vehicle running voltage 44 output by the alternator. Because the functionality of a battery 30 requires that it be charged by the power output by the alternator 32, a vehicle electrical supply system which is failing to supply sufficient power to a starter motor 34 to initiate the engine 36 may either be a result of a malfunctioning battery 30 or a malfunctioning alternator 32 which is failing to supply sufficient power to recharge the battery 30. Thus, it may be required to first diagnose the functional condition of the alternator 32, in that it outputs power of a sufficient voltage to properly recharge the battery 30. In a preferred embodiment of a typical passenger vehicle 12, an alternator 32 in a proper operational condition will output a vehicle running voltage 44 range from about 13.2 volts to 15.1 volts. A vehicle running voltage 44 outside this range may indicate that the alternator 32 is in a malfunctioning operational condition. However, it may also be seen that other alternators 32 may output a vehicle running voltage 44 in which the range of functional operation varies. The vehicle running voltage 44 may be a measurement at a specific point in time following engine 36 ignition and prior to engine 36 shut-off, or may be a running average determined by taking a series of measurements at predefined intervals of time so long as the vehicle engine 36 is running, or other scheme, such as storing as the vehicle running voltage 44 the point of most deviation from a predetermined desired alternator 32 voltage output while the engine 36 is running.

Once the engine 36 has been turned off, the alternator 32 no longer produces power, and the monitoring unit 18 may then measure and store the vehicle off voltage 46 output by the battery 30. It may be appreciated that such a measurement may occur immediately, or after a period of time. Allowing a period of time to elapse may allow the surface voltage of the battery 30 to clear, resulting in a more accurate reading. For example, a waiting period of around 10 minutes is usually sufficient to allow surface voltage of a battery 30 to clear. Such a measurement may indicate of the capability of the battery 30 to store a sufficient amount of electrical power supplied by the alternator 30. In a particular embodiment with a typical passenger vehicle battery 30, the vehicle off voltage 46 output by the battery will be between 12.2 and 12.72 volts for a sufficiently charged and functional battery. However, it may also be seen that other batteries 30 may output a vehicle off voltage 46 in which the range of voltage output for a sufficiently charged and functional will differ. It may be seen that under certain conditions, a vehicle 12 may only be operated for a short time period, during which even a properly functioning battery 30 will not have sufficiently been recharged by a properly functioning alternator 32. Thus, it is contemplated that in certain embodiments, vehicle off voltages 46 and vehicle minimum voltages 42 measured when the vehicle engine 36 has been running for less than a predetermined period of time may be disregarded and not measured, or the prior measurement in which such a running duration did elapse may be substituted. For example, a typical alternator 32 in good operation condition and producing 14 volts may take around 15 minutes to restore a battery 30 to a full charged condition following a voltage fluctuation 40 resulting in engine 36 ignition, so a period of 15 minutes may be used in such an embodiment.

Figure 5:
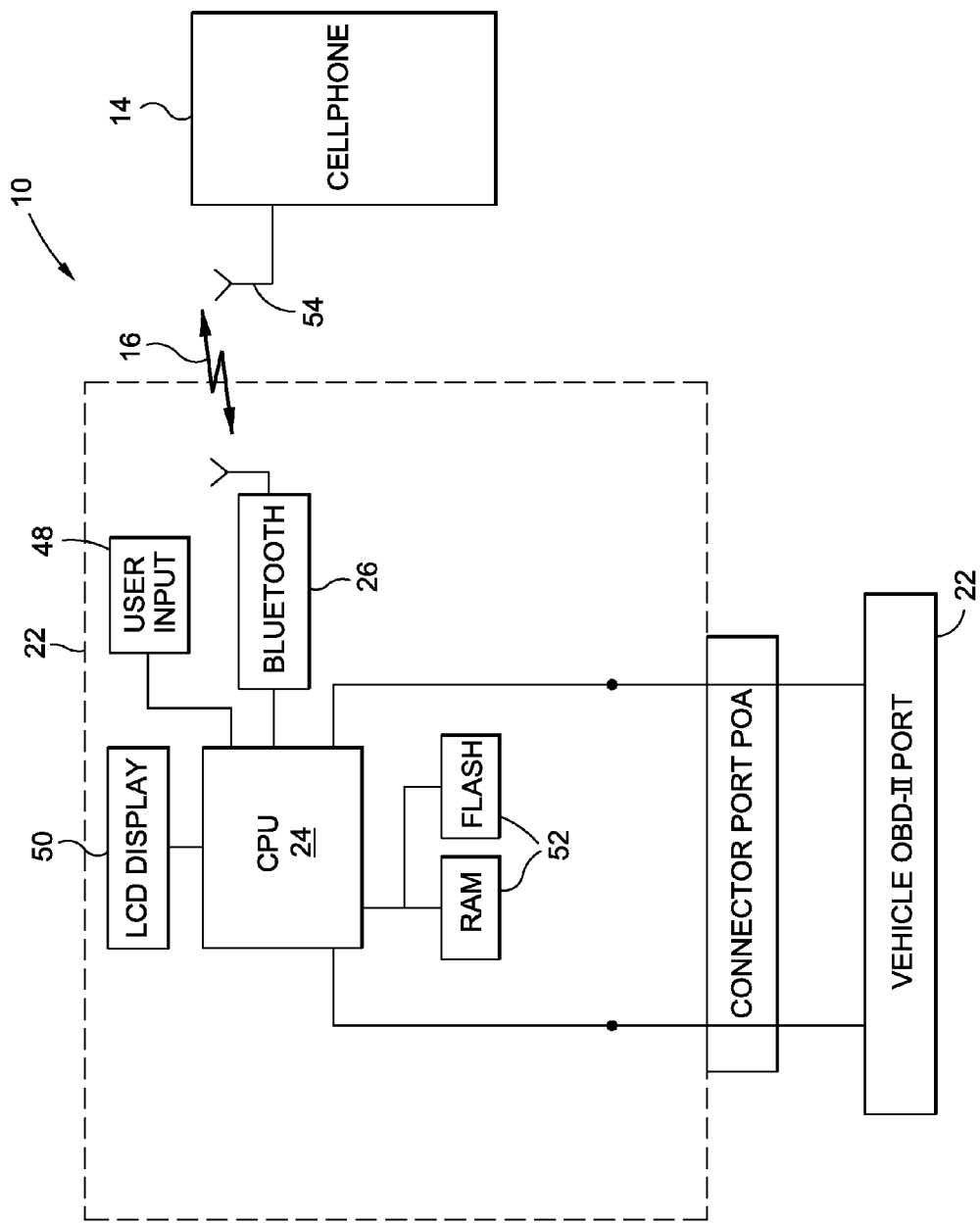
FIG. 5 is a block diagram showing the interconnections between components of an exemplary monitoring unit.

Referring now to FIG. 5, a block diagram illustrating the interconnections between components of a preferred embodiment of a monitoring unit 18 and receiver unit 14 according to one aspect of the present application is provided. In a preferred embodiment, in addition to the monitoring circuit 24 in communication with diagnostic port 22 and wireless communication circuit 26, the embodiment may also include on the monitoring unit a monitoring unit user input device 48, a monitoring unit output device 50, a monitoring unit memory 52, and a wireless receiver 54 on the receiver unit.

In order to make the determination on the monitoring circuit 24 of the functional status of the electrical supply system, the monitoring circuit, which in a preferred embodiment is a central processing unit (CPU), makes comparisons of the measured voltages to predefined criteria. Prior to the determination of the operational condition of the battery 30, the operational status of the alternator 32 may be determined. This may be done by comparing on the monitoring circuit 24 a measured vehicle running voltage 44 output by the alternator 32 to a first predefined criteria. In the preferred embodiment, this first predefined criteria is a voltage range correlating to the voltage output by an alternator 32 in an operational condition. In a more preferred embodiment, this voltage range is from 13.2 volts to 15.1 volts. However it may also be seen that other criteria may be utilized, including other voltage ranges or voltage thresholds such as minimums or maximums, or a series of ranges indicative of various gradients of operational statuses. Thus, it may be seen that the determination of alternator 32 functionality need not be limited to a comparison which returns a binary result of functional or non-functional, but may also return a multiplicity of results, including for example one or more levels of functionality, or levels of severity of malfunction. For example, a percentage threshold may be determined on the monitoring circuit by the comparison of the vehicle running voltage 44 to the first predefined criteria, wherein 100% may indicate perfect functionality, and below 50% may indicate a malfunction, with the intervening percentages indicating various degrees of functionality, and percentages lower than 50% may indicate various degrees of malfunction.

Once the alternator 32 has been determined to be in a functional operating condition, the battery 30 operational [[ ]]status may then be determined by making a comparison of the vehicle minimum voltage 42 and the vehicle off voltage 46 to a second predefined criteria. Such a comparison may, as stated above, only take place if the vehicle engine 36 and alternator 32 have been running for a predetermined period of time, so as to allow sufficient time for the battery 30 to have its charge restored. Both the vehicle minimum voltage 42 and the vehicle off voltage 46 may be used in this determination so as to determine the ability of the battery 30 to sufficiently retain a charge as well as the ability of the battery 30 to be recharged. In a preferred embodiment, the second predefined criteria is a decision matrix incorporating both the vehicle minimum voltage 42 and the vehicle off voltage 46 as inputs, and having as outputs conditions representative of the battery 30 operational status. In an exemplary embodiment, the decision matrix is the decision matrix of FIG. 8.

It may be seen that in other embodiments, however, the second predefined criteria may be other algorithms, such as various ranges or thresholds applicable to one or both of the vehicle minimum voltage 42 or the vehicle off voltage 46. Additionally, other determination outputs may be utilized which vary from the determination output of FIG. 8, such as a percentage output similar to that described above for the battery 30 operating status determination wherein various percentages between 0% and 100% may indicate varying degrees of functionality or severity of malfunction.

Once a vehicle alternator status or a vehicle battery status has been determined by the monitoring circuit 24 of the monitoring unit 18, a status signal 16 may be generated by the monitoring circuit. The status signal 16 may, in one particular embodiment, comprise alternator malfunction signal or a battery malfunction signal, indicative of an alternator 32 or battery 30 malfunction. When no malfunction is detected, no status signal 16 will be generated. In other embodiments, however, the status signal 16 may comprise, for example, an alternator status signal and a battery status signal representative of the determined vehicle alternator status and vehicle battery status. In a preferred embodiment, the status signal may comprise the measured voltage data as well as a "Good", "OK" or "Malfunction" indication. However, it may be seen that the status signal 16 may convey or not convey any information relevant to determination of functional condition of a vehicle electrical supply system.

The status signal 16 may also consist of other vehicle information received from the vehicle 12, such as vehicle identification information. In one particular embodiment, the vehicle identification information may be a VIN number. It may also be seen that vehicle identification information may consist of, for example, year, make and model information, or a predefined or definable indicia corresponding to the vehicle. Thus, a status signal 16 including vehicle identification information may aid in allowing a network of multiple monitoring units 18 to communicate with a single receiver unit 14, which may be, for example, a central hub wherein a fleet of vehicles 12 may be monitored, or a single cellphone in a case where multiple vehicles 12 may be driver by a single user.

It may also be seen that the status signal 16 may be communicated to and wirelessly transmitted from a wireless communication circuit 26 to a wireless receiver 54 of a receiver unit 14, and may also be communicated to a monitoring unit output device 50. In a preferred embodiment, the monitoring unit output device is an LCD display. However, it may also be seen that the monitoring unit output device 50 may be other types of graphical displays, or other output devices such as auditory or tactile outputs. The monitoring unit output device 50 may communicate a warning to the vehicle operator of a malfunction in the vehicle's battery 30 or alternator 32, or may display the functional condition of the alternator 32 or battery 30, and may find use in embodiments in which a receiver unit 14 is optional, or in which no wireless communication circuit 26 is present. In a preferred embodiment, the monitoring unit output device 50 serves in combination with a monitoring unit input device 48 to allow modification of the first and second predefined criteria. For example, many larger vehicles such as buses or trucks may use alternators 32 which produce higher voltages than found in passenger vehicles, and may use larger batteries 30 or multiple batteries 30 which results in a higher battery voltage. Thus, it may be useful to allow a user to configure the parameters of the first and second predefined criteria to correspond to those specific vehicles 12, and to utilize the monitoring unit input device 48 and the monitoring device output device to perform such configurations. The monitoring unit input device 48 may be, for example, a touchscreen or one or more buttons. However, it may be seen that any sort of input method may be utilized. For example, in a preferred embodiment, the monitoring unit input device consists of a receiver, which may be juxtaposed with the wireless communication circuit 26 to form a transceiver, to communication with the receiver unit 14 on which tactile inputs may be located. The receiver unit 14 may then be able to communicate wirelessly with the monitoring unit 18 via a transmitter of its own, which may also be juxtaposed with its wireless receiver 54, to communicate with the monitoring unit to configure the first and second predefined criteria.

Figure 6:
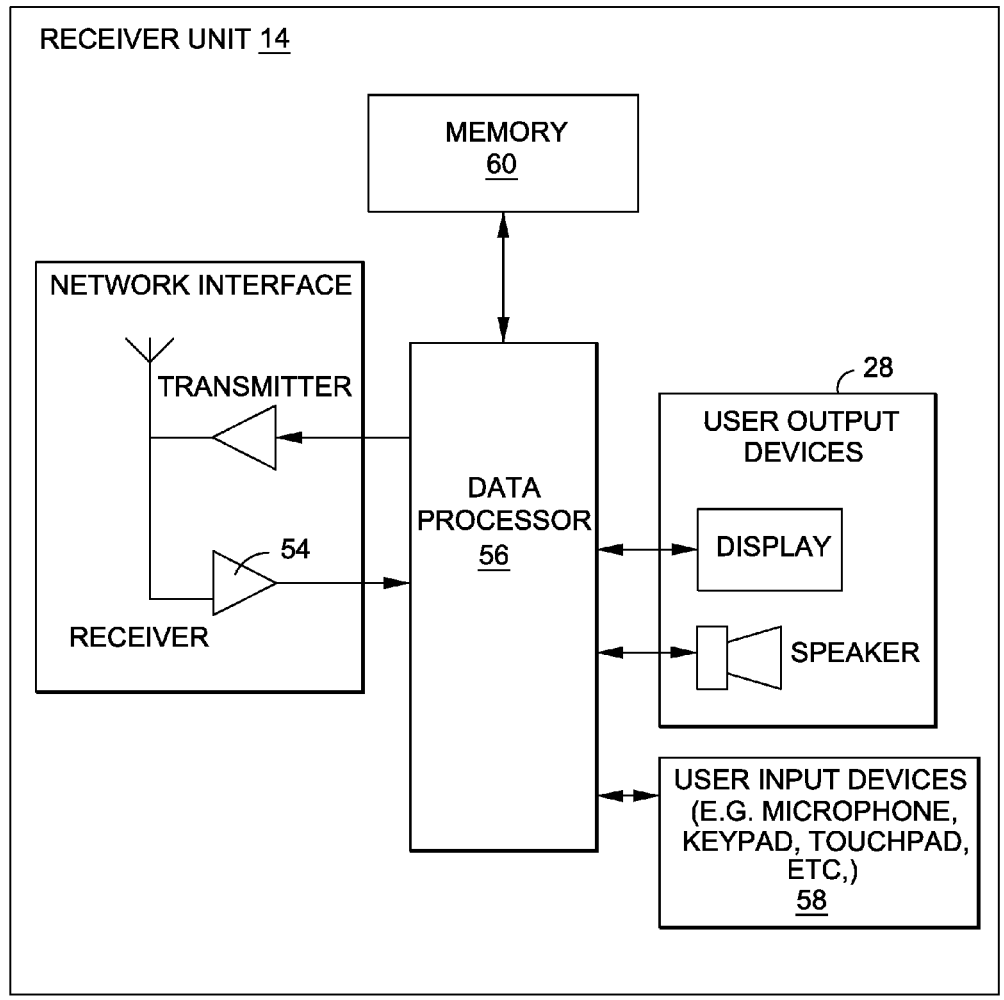
FIG. 6 is a block diagram showing the interconnections between components of an exemplary receiver unit.

Referring now to FIG. 6, a block diagram of the various components of a receiver unit 14 of an exemplary embodiment is shown. It may be seen that the exemplary embodiment includes, in addition to the above described receiver unit output device 28, a wireless receiver 54, a receiver unit data processor 56, a receiver unit user input device 58, and a receiver unit memory 60.

The wireless receiver 54 may be, for example but without limitation, a local receiver such as a Wi-Fi or Bluetooth receiver, or a long-range receiver such as a radio receiver. In one exemplary embodiment, the wireless receiver 54 is a Bluetooth receiver. However, it may be seen that any wireless receiver may be used which may receive the status signals 16 from the wireless communication circuit 26 of the monitoring unit 18. In one exemplary embodiment, it is contemplated that such conveyance of the status signals 16 will occur over a very short distance, as the receiving unit 14 in this exemplary embodiment is a cellular telephone typically carried on or near to the user's person, typically the driver or a passenger in the vehicle 12. The status signals 16 will usually be sent when the user is within or in close proximity to the vehicle 12.

In one exemplary embodiment, the receiver unit data processor 56 is a CPU, ideally the CPU of a smart phone with a mobile operating system. However, it may be seen that receiver unit data processor 56 may be any apparatus in communication with the receiver unit output device 28 and the wireless receiver 54, and is operative to receive status signals 16 from the wireless receiver 54 and cause the output device 28 to generate a warning notification upon receipt on the receiver unit data processor 56 of a status signal representative of a malfunctioning operational condition of the alternator 32 or battery 30.

In some exemplary embodiments, the receiver unit user input device comprises the input features of a smart phone with a mobile operating system. In some smart phones, the input module 58 may also be the receiver unit output device 28 itself, for example, when the smart phone uses a capacitive interface or other form of touch screen. In other smart phones, alternatively or in addition to a touch screen, buttons or other form of user inputs may be provided as the an receiver unit input device 58. It may be seen that in other embodiments of a receiver unit 14, the receiver unit user input device 58 may vary widely in form and functionality, depending on the form of input itself. For example, many cellular phones are able to accept auditory inputs in addition to mechanical or electronic input.

It is additionally contemplated that the receiver unit 14 may have a receiver unit memory 60 for storage of data corresponding to determining alternator 32 and battery 30 operating status derived from the received status signals 16. The receiver unit memory 60 may be, for example but without limitation, a volatile memory such as a CPU cache or random access memory, or a non-volatile memory such as solid state or flash memory or hard or optical drives.

It is additionally contemplated that in certain alternative embodiments, voltage data including the vehicle minimum voltage 42, the vehicle running voltage 44, and the vehicle off voltage 46 may be transmitted to the receiving unit, and the determinations of alternator 32 and battery 30 operational condition by comparisons according to the first and second predefined criteria, as described above, may occur on the receiver unit data processor 56 instead of the monitoring circuit 28. In such an embodiment, a status signal such as a battery malfunction signal or alternator malfunction signal may be generated on the receiver unit data processor 56 and communicated to the receiver unit output device 28 for generation of a warning notification.

Figure 7:
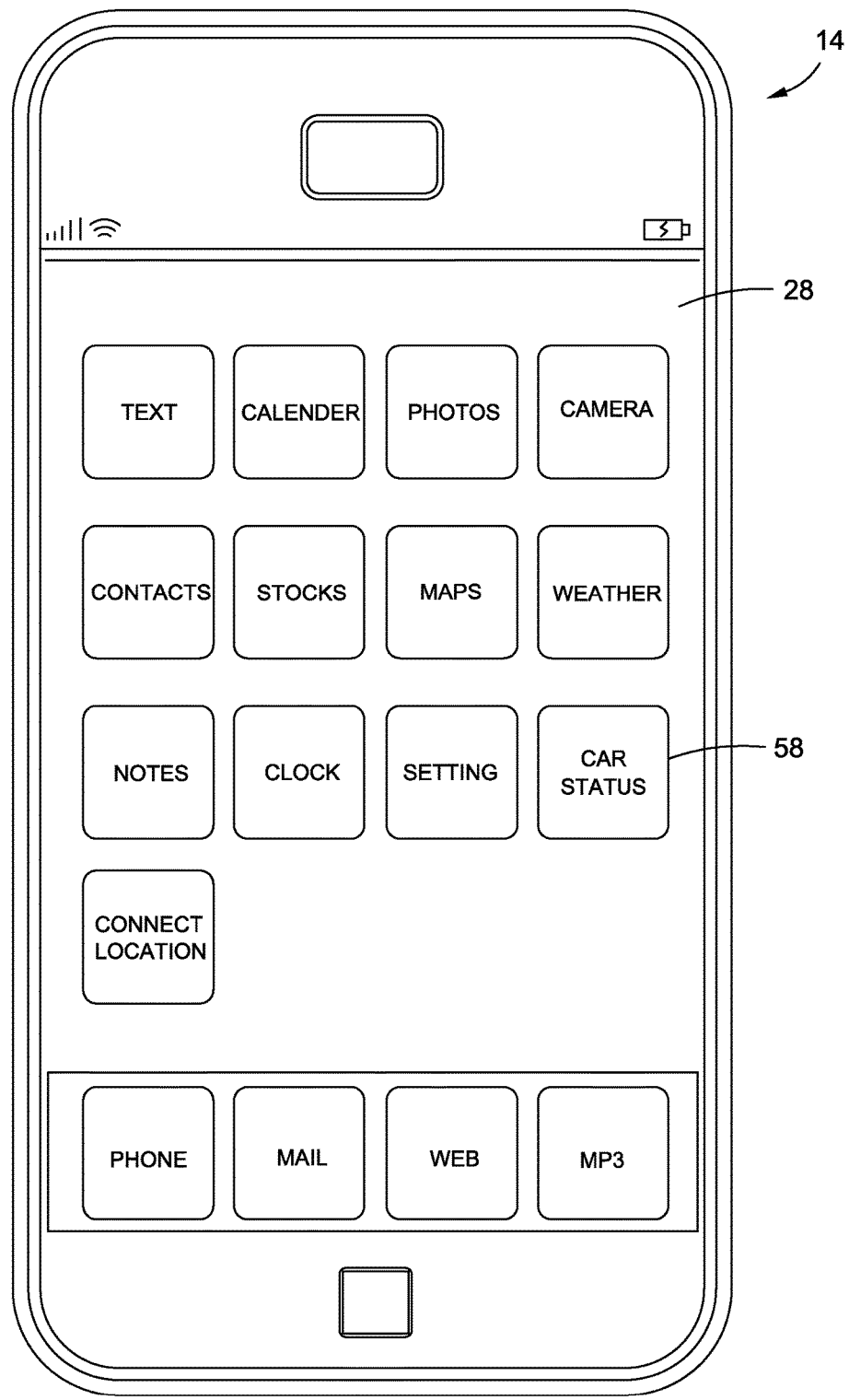
FIG. 7 is front view of an exemplary receiver unit.

Referring now to FIG. 7, it may be seen that the receiver unit 14 may be a smart phone with a mobile operating system, and the receiver unit output device 28 may be implemented as the screen of the smart phone. In such an embodiment, the receiver unit user input device 58 may be a touch screen of the smart phone. It may thus be seen that another aspect of the present application may be an article of manufacture comprising a non-transitory computer readable medium readable by a receiver unit data processor 56, the medium tangibly embodying one or more programs of instructions executable by the receiver unit data processor 56. An exemplary version of such an embodiment may be a software application for a smart phone which functions to alert the user of an alternator 32 or battery 30 malfunction via a warning notification generated on a receiver unit output device 28 upon receipt of a status signal on the receiver unit data processor 56 which corresponds to an alternator 32 operational status or battery 30 operational status corresponding to a malfunction. It is additionally contemplated that such an embodiment may allow the user to view the status of a vehicle's 12 alternator 32 or battery 30 corresponding to the most recently received status signal in response to a user input as most recently received, such as by activation of the software application.

It may also be appreciated that certain embodiments may be configured to interface with hybrid vehicles in which the battery system, instead of being a typical 12-volt automotive battery, may be one or more larger batteries. For example, the second generation Toyota Prius utilizes a 201.6 volt nickel metal hydride traction battery in conjunction with an electronic motor to provide primary motive power, which is kept optimally at around a 60% level of charge by a battery control module, which actively monitors the charge status of the battery. The gasoline engine is only used in conjunction with an alternator to recharge the battery. Other hybrid vehicles, however, may utilize different schemes, where for example motive power may be provided by a gasoline engine at times and an electrical motor at other times or by both a gasoline and electric motor simultaneously. It may thus be seen that instead of consulting directly the voltage output by the battery, the battery voltage or battery status may instead be determined by interfacing with the vehicle's battery control module, and querying the battery voltage or battery status therefrom.

In such an embodiment, the battery control module may be checked by, for example, reading the OEM live data for the battery pack integrity, or by querying by OBD II service the state of charge of a hybrid battery, and determining battery health therefrom.

Reading the OEM live data may encompass transmitting a request to the battery control module, and receiving a data response therefrom. Such data response may be, for example, a confirmation that the battery pack is operating correctly, or a recommendation that the battery pack be refreshed, reactivated, have its state of charge reset, be equalized, or be replaced. It may be seen that such a data response may be read by the above described system in order to determine a battery status.

Alternatively, a direct check of the state of charge of the hybrid/EV battery may be undertaken via an OBD II interface with the battery control module. In such an embodiment, the system may directly query the state of charge of the hybrid battery. Such a system may, for example, utilize a second criteria wherein in a good operational battery status is determined for states of charge with battery status outputs greater than 80%, a moderately functional operational battery status for states of charge with battery status outputs between 55-80%, and a malfunctioning operational battery status is determined for states of charge having battery status outputs lower than 55%. Alternative schemes for determining battery operational status from battery state of charge, voltage, or other types of outputs, however, are within the scope of the present disclosure as well.

The above description is given by way of example, and not limitation. Given the above disclosure, one skilled in the art could devise variations that are within the scope and spirit of the invention disclosed herein, including various ways of configuring the monitoring unit 18 or the receiver unit 14. Further, the various features of the embodiments disclosed herein can be used alone, or in varying combinations with each other and are not intended to be limited to the specific combination described herein. Thus, the scope of the claims is not to be limited by the illustrated embodiments.

What is claimed is:

1. A method for monitoring a vehicle status for a vehicle having a battery and an alternator, the method comprising the steps of:
   detecting on a monitor a voltage fluctuation of the voltage output by the battery;
   determining whether the voltage fluctuation has signal attributes characteristic of initiation of a starter motor, and determining therefrom that the vehicle has started;
   ascertaining a vehicle minimum voltage of the voltage fluctuation;
   after the vehicle has been determined to have started, measuring a vehicle running voltage;
   performing a first comparison, of the vehicle running voltage to a first predefined criterion, and determining from that first comparison a vehicle alternator status representative of an operational condition of the alternator;
   after the vehicle has been turned off, measuring a vehicle off voltage output at the battery; and
   performing a second comparison of the vehicle minimum voltage and the vehicle off voltage according to a second predefined criterion, and determining from that second comparison a vehicle battery status representative of an operational condition of the battery.

2. The method of claim 1, further comprising the steps of:
   generating an alternator status signal representative of the determined operation condition of the alternator;
   communicating the alternator status signal from a monitor to a receiver unit; and
   generating a warning notification on the receiver unit when the received alternator status signal is representative of a malfunctioning operational condition.

3. The method of claim 1, further comprising the steps of:
   generating a battery status signal representative of the determined operational condition of the battery;
   communicating the battery status signal from the a transmitter to a receiver unit; and generating a warning notification on the receiver unit when the received battery status signal is representative of a malfunctioning operational condition.

4. The method of claim 1, wherein the first predefined criterion comprises a voltage range representative of a voltage output of a properly functioning alternator, and wherein the vehicle alternator status is determined to be in a malfunctioning operational condition when the vehicle running voltage is determined to be outside of the voltage range.

5. The method of claim 4, wherein the voltage range is from 13.2 volts to 15.1 volts.

6. The method of claim 1, wherein the second predefined criterion comprises a set of conditions representative of a properly functioning battery.

7. A system for monitoring a vehicle status the system comprising:
   a monitoring circuit in electrical communication with a vehicle electronic control unit (ECU) for receiving from the ECU:
      a vehicle minimum voltage output by the battery during initiation of a starter motor;
      a vehicle running voltage while the vehicle is running; and
      a vehicle off battery voltage output by the battery after the vehicle has been subsequently turned off; and
   a data processor in communication with the monitoring circuit for receiving and storing the vehicle minimum voltage, the vehicle running voltage, and the vehicle off voltage, the data processor being operative to perform a first comparison of the vehicle running voltage to a predetermined running voltage range and to generate an alternator malfunction signal if the vehicle running voltage is outside the predetermined running voltage range; the data processor further being operative to perform a second comparison of the minimum battery voltage and the vehicle off battery voltage and to generate a battery malfunction signal if the battery is not sufficiently retaining a charge.

8. The system of claim 7, wherein the predetermined running voltage range is from 13.2 to 15.1 volts.

9. The system of claim 7, wherein a battery malfunction signal is also generated in response to a determination that the vehicle minimum voltage is below a predetermined minimum battery output level.

10. The system of claim 7, wherein the monitoring circuit is operatively connectable to the vehicle ECU via a vehicle diagnostic port.

11. The system of claim 7, wherein the system further includes a receiver, and the monitoring circuit further comprises a wireless communication circuit in communication with the data processor for wirelessly communicating the alternator malfunction signal or the battery malfunction signal to the receiver.

12. The system of claim 11, wherein the receiver is a cellular telephone.

13. The system of claim 11, wherein the receiver comprises a wireless receiver for receiving the alternator malfunction signal or the battery malfunction signal from the monitoring circuit.

14. The system of claim 11, wherein the monitoring circuit is further operative to retrieve vehicle identification information from the vehicle ECU, and is operative to wirelessly communicate the vehicle identification information to the receiver.

15. The system of claim 14, wherein the vehicle identifying information comprises a vehicle identification number (VIN).

16. The system of claim 11, wherein the receiver is operable to receive alternator malfunction signals or battery malfunction signals from multiple monitoring circuits.

17. The system of claim 11, wherein the receiver is operative to generate an alternator malfunction warning notification in response to receipt on the receiver of the alternator malfunction signal.

18. The system of claim 11, wherein the receiver is further operative to generate a battery malfunction warning notification in response to receipt on the receiver of the battery malfunction signal.

19. A system for monitoring a vehicle status, the system comprising:
   a monitor having a monitoring circuit and a wireless communication circuit, the monitoring circuit being in electrical communication with a vehicle electronic control unit (ECU) for receiving from the ECU a vehicle minimum voltage output by the battery during initiation of a starter motor, a vehicle running voltage while the vehicle is running, and a vehicle off voltage output by the battery after the vehicle has been subsequently turned off, and the wireless communication circuit being in communication with the monitoring circuit for transmitting the vehicle minimum voltage, the vehicle running voltage, and the vehicle off voltage; and
   a receiver, the receiver having a wireless receiver circuit and a data processor, the wireless receiver circuit being for receiving from the wireless communication circuit the vehicle minimum voltage, the vehicle running voltage, and the vehicle off voltage, and the data processor being in communication with the wireless receiver circuit for receiving and storing the vehicle minimum voltage, the vehicle running voltage, and the vehicle off voltage;
   wherein the data processor is operative to perform a first comparison of the vehicle running voltage to a predetermined running voltage range and to generate an alternator malfunction signal in response to determining from that first comparison that the vehicle running voltage is outside the predetermined running voltage range; the data processor being further operative to perform a second comparison of the vehicle minimum voltage and the subsequent vehicle off voltage and to generate a battery malfunction signal in response to determining from the second comparison that the battery is not sufficiently retaining a charge.

20. The system of claim 19, wherein a battery malfunction signal is also generated in response to a determination that the vehicle minimum voltage is below a predetermined minimum battery output level.

21. A method for monitoring a hybrid vehicle status for a hybrid vehicle having a battery, a battery controller, and an alternator, the method comprising the steps of:
   as the vehicle is running, measuring a vehicle running voltage;
   comparing the vehicle running voltage to a first predefined criterion, and determining therefrom a vehicle alternator status representative of an operational condition of the alternator;
   after the vehicle has been turned off, measuring a battery status output at the battery controller; and comparing the battery status output to a second predefined criterion, and determining therefrom a vehicle battery status representative of an operational condition of the battery.

* * * * *